(12) United States Patent
Reznicek et al.

(10) Patent No.: US 10,622,406 B2
(45) Date of Patent: Apr. 14, 2020

(54) DUAL METAL NITRIDE LANDING PAD FOR MRAM DEVICES

(71) Applicant: International Business Machines Corporation, Armonk, NY (US)

(72) Inventors: Alexander Reznicek, Troy, NY (US); Oscar van der Straten, Guilderland Center, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/026,405

(22) Filed: Jul. 3, 2018

(65) Prior Publication Data
US 2020/0013826 A1    Jan. 9, 2020

(51) Int. Cl.
| | |
|---|---|
| *H01L 27/22* | (2006.01) |
| *H01L 43/12* | (2006.01) |
| *H01L 43/02* | (2006.01) |
| *H01L 21/768* | (2006.01) |
| *H01L 43/10* | (2006.01) |
| *H01L 23/532* | (2006.01) |
| *H01L 43/08* | (2006.01) |
| *H01L 41/12* | (2006.01) |
| *H01L 43/06* | (2006.01) |

(Continued)

(52) U.S. Cl.
CPC ........ *H01L 27/222* (2013.01); *G11C 13/0002* (2013.01); *H01L 21/76829* (2013.01); *H01L 21/76831* (2013.01); *H01L 21/76832* (2013.01); *H01L 21/76834* (2013.01); *H01L 21/76895* (2013.01); *H01L 23/5329* (2013.01); *H01L 27/2409* (2013.01); *H01L 41/12* (2013.01); *H01L 41/20* (2013.01); *H01L 41/22* (2013.01); *H01L 41/27* (2013.01); *H01L 41/297* (2013.01); *H01L 43/02* (2013.01); *H01L 43/04* (2013.01); *H01L 43/06* (2013.01); *H01L 43/065* (2013.01); *H01L 43/08* (2013.01); *H01L 43/10* (2013.01); *H01L 43/12* (2013.01); *H01L 45/1233* (2013.01); *H01L 45/1253* (2013.01); *H01L 45/16* (2013.01)

(58) Field of Classification Search
CPC ............ H01L 27/222; H01L 21/76829; H01L 21/76831; H01L 21/76832; H01L 21/76834; H01L 21/76895; H01L 43/02; H01L 43/04; H01L 43/06; H01L 43/065; H01L 43/08; H01L 43/10; H01L 43/12; H01L 41/12; H01L 41/20; H01L 41/22; H01L 41/27; H01L 41/297; H01L 45/1233; H01L 45/1253; H01L 45/16; H01L 27/2409; G11C 13/0002
See application file for complete search history.

(56) References Cited

U.S. PATENT DOCUMENTS

| | | |
|---|---|---|
| 5,719,071 A | 2/1998 | Miller et al. |
| 6,025,265 A | 2/2000 | Miller et al. |

(Continued)

*Primary Examiner* — Feifei Yeung Lopez
(74) *Attorney, Agent, or Firm* — Scully, Scott, Murphy & Presser, P.C.; L. Jeffrey Kelly, Esq.

(57) ABSTRACT

A dual nitride landing pad for a high performance magnetoresistive random access memory (MRAM) device is formed on a recessed surface of the least one electrically conductive structure in a MRAM device area. The dual nitride landing pad includes a bottom metal nitride landing pad and a TaN-containing landing pad.

10 Claims, 6 Drawing Sheets

(51) Int. Cl.
  *H01L 41/20* (2006.01)
  *H01L 41/297* (2013.01)
  *H01L 41/27* (2013.01)
  *H01L 45/00* (2006.01)
  *H01L 41/22* (2013.01)
  *H01L 43/04* (2006.01)
  *H01L 27/24* (2006.01)
  *G11C 13/00* (2006.01)

(56) References Cited

U.S. PATENT DOCUMENTS

| | | | |
|---|---|---|---|
| 7,083,990 B1 * | 8/2006 | Leuschner | H01L 27/222 257/E21.665 |
| 8,524,511 B1 | 9/2013 | Zhong et al. | |
| 8,772,051 B1 | 7/2014 | Zhong et al. | |
| 8,822,234 B2 | 9/2014 | Wang et al. | |
| 9,012,995 B2 | 4/2015 | Kakoschke et al. | |
| 9,768,376 B2 | 9/2017 | Sandhu et al. | |
| 9,818,935 B2 | 11/2017 | Chuang et al. | |
| 2002/0185196 A1 * | 12/2002 | Shin | B82Y 25/00 148/108 |
| 2003/0157750 A1 * | 8/2003 | Narukawa | H01L 21/28562 438/118 |
| 2006/0197099 A1 * | 9/2006 | Tomioka | H01L 24/05 257/91 |
| 2009/0218644 A1 * | 9/2009 | Lee | B82Y 10/00 257/421 |
| 2010/0097846 A1 * | 4/2010 | Sugiura | H01L 27/228 365/158 |
| 2011/0129946 A1 * | 6/2011 | Zhong | H01L 27/228 438/3 |
| 2013/0119494 A1 * | 5/2013 | Li | H01L 43/08 257/421 |
| 2015/0249206 A1 * | 9/2015 | Kim | H01L 43/02 257/421 |
| 2017/0179378 A1 * | 6/2017 | Kar | H01L 43/12 |
| 2018/0366517 A1 * | 12/2018 | Lin | H01L 27/228 |

* cited by examiner

DUAL METAL NITRIDE LANDING PAD FOR MRAM DEVICES

BACKGROUND

The present application relates to a semiconductor structure and a method of forming the same. More particularly, the present application relates to a semiconductor structure including a dual metal nitride landing pad for embedded high performance magnetoresistive random access memory (MRAM) devices.

MRAM is a non-volatile random access memory technology in which data is stored by magnetic storage elements. These elements are typically formed from two ferromagnetic plates, each of which can hold a magnetization, separated by a thin dielectric layer. One of the two plates is a permanent magnetic set to a particular polarity; the other plate's magnetization can be changed to match that of an external field to store memory. Such a configuration is known as magnetic tunnel junction (MTJ).

For high performance MRAM based on perpendicular MTJ structures, well defined interfaces and interface control are essential. MTJ structures typically include a cobalt (Co)-based synthetic anti-ferromagnetic (SAF), a cobalt-iron-boron (CoFeB)-based reference layer, a magnesium oxide (MgO)-based tunnel barrier, a CoFeB-based free layer, and capping layers containing, for example, tantalum (Ta) and/or ruthenium (Ru). Embedded MTJ structures are usually formed by patterning of blanket MTJ stacks.

Also, landing pads for MRAM devices are required to be very uniform with very low surface roughness, i.e., the dielectric recessed around a metal landing pad must be less than 2 nm. Typically, chemical mechanical polishing (CMP) is used to create a damascene tantalum nitride (TaN) landing pad. However, CMP non-uniformity between isolated, wide pitch MRAM devices and dense, narrow pitch ground rule lines results in either ground rule line-to-line shorts, or excessive dielectric recess around the landing pads.

In view of the above, there is need to provide a landing pad for embedded high performance MRAM devices which can avoid the drawbacks mentioned above for conventional MRAM landing pads.

SUMMARY

A dual nitride landing pad for a high performance magnetoresistive random access memory (MRAM) device is formed on a recessed surface of the least one electrically conductive structure in a MRAM device area. The dual nitride landing pad includes a bottom metal nitride landing pad and a TaN-containing landing pad.

In one aspect of the present application, a method of forming a semiconductor structure is provided. In one embodiment, the method includes providing at least one electrically conductive structure embedded in a dielectric material layer and located in a MRAM device area. The at least one electrically conductive structure in the MRAM device area is then recessed, and thereafter a dual nitride landing pad is formed on a recessed surface of the least one electrically conductive structure in the MRAM device area. The dual nitride landing pad includes a bottom metal nitride landing pad and a TaN-containing landing pad. A dielectric capping layer is then formed on the dielectric material layer. The dielectric capping layer has a topmost surface that is coplanar with a topmost surface of the TaN-containing landing pad. A magnetic tunnel junction (MTJ) structure is then formed on the TaN-containing landing pad. Next, an interlayer dielectric (ILD) material layer is formed laterally adjacent the MTJ structure and having a topmost surface that is coplanar with a topmost surface of the MTJ structure. At least an electrically conductive metal or metal alloy layer is then formed on the MTJ structure and the ILD material layer.

In another aspect of the present application, a semiconductor structure is provided. In one embodiment the semiconductor structure includes at least one electrically conductive structure embedded in a dielectric material layer and located in a MRAM device area, the at least one electrically conductive structure having a recessed surface. A dual nitride landing pad is located on recessed surface of the least one electrically conductive structure in the MRAM device area, the dual nitride landing pad includes a bottom metal nitride landing pad and a TaN-containing landing pad. A dielectric capping layer is located on the dielectric material layer, the dielectric capping layer has a topmost surface that is coplanar with a topmost surface of the TaN-containing landing pad. A magnetic tunnel junction (MTJ) structure is located on the TaN-containing landing pad. An interlayer dielectric (ILD) material layer is laterally adjacent the MTJ structure and has a topmost surface that is coplanar with a topmost surface of the MTJ structure. At least an electrically conductive metal or metal alloy layer is located on the MTJ structure and the ILD material layer.

DETAILED DESCRIPTION

Figure 1:
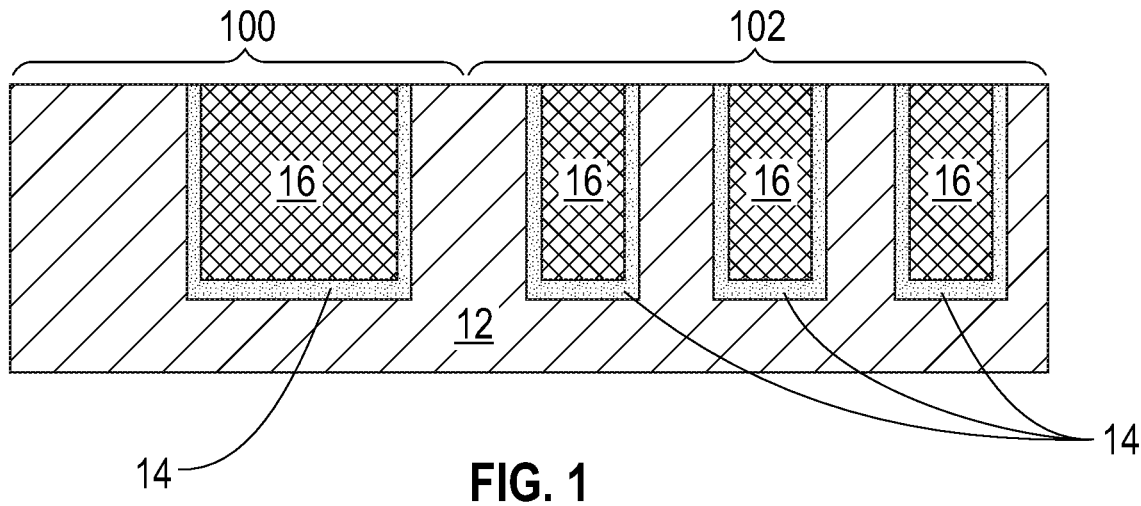
FIG. 1 is a cross sectional view of an exemplary semiconductor structure of the present application during an early stage of fabrication, and including a plurality of electrically conductive structures embedded in a dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) device (i.e., memory cell) for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ storage element results in a change to the MTJ resistance, hence the name "Magnetoresistive" RAM.

Referring first to FIG. 1, there is illustrated an exemplary semiconductor structure of the present application during an early stage of fabrication, and containing a plurality of electrically conductive structures 16 embedded in a dielectric material layer 12. As is shown, the exemplary structure includes a first device area in which a high performance embedded MRAM containing a magnetic tunnel junction (MTJ) structure will be subsequently formed (hereinafter MRAM device area 100), and a second device area in which other types of devices such as, for example, logic devices, are present (hereinafter referred to as non-MRAM device area 102). When logic devices are present in the non-MRAM device area 102, the logic devices would be located in a front-end-of-the-line (FEOL) level that would be located beneath the dielectric material layer 12. A diffusion barrier liner 14 is typically present between each electrically conductive structure 16 and the dielectric material layer 12.

The dielectric material layer 12 may include an inorganic dielectric material or an organic dielectric material. In one embodiment, the dielectric material layer 12 may be non-porous. In another embodiment, the dielectric material layer 12 may be porous. Some examples of suitable dielectric materials that may be used as dielectric material layer 12 include, but are not limited to, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material layer 12 may vary depending upon the type of dielectric material(s) used. In one example, the dielectric material layer 12 may have a thickness from 50 nm to 1000 nm. Other thicknesses that are lesser than, or greater than, the aforementioned thickness range may also be employed in the present application for the thickness of the dielectric material layer 12. The dielectric material layer 12 may be formed utilizing any deposition process including, but not limited to, chemical vapor deposition (CVD), plasma enhanced chemical vapor deposition (PECVD) or spin-on coating.

The dielectric material layer 12 is then processed to include a plurality of openings (not shown). A single opening and/or a plurality of openings can be formed into each of the MRAM device area 100 of the dielectric material layer 12, and the non-MRAM device area 102 of the dielectric material layer 12. In the illustrated embodiment of FIG. 1, a single opening is formed into the MRAM device area 102 of the dielectric material layer 12, while three openings are formed into the non-MRAM device area 102 of the dielectric material layer 12. The openings, which are used to house, the electrically conductive structures 16, may extend partially through the dielectric material layer 12 (illustrated embodiment of FIG. 1) or entirely through the dielectric material layer 12 (not shown in the drawings of the present application). The openings may be via openings or line openings. The openings may be formed by lithography and etching. In some embodiments (not shown), each of the openings that is formed into the dielectric material layer 12 has a same width. In other embodiments (illustrated embodiment of FIG. 1), the opening(s) that are formed into the MRAM device area 100 may have a greater width than the opening(s) formed into the non-MRAM device area 102.

In some embodiments, and prior to forming the openings, a hard mask material layer (not shown) is formed on the dielectric material layer. The hard mask material may be composed of a dielectric oxide, a dielectric nitride and/or a dielectric oxynitride. In one example, the hard mask material may be composed of silicon dioxide and/or silicon nitride. The hard mask material layer may be formed utilizing a deposition process such as, for example, chemical vapor deposition (CVD) or plasma enhanced chemical vapor deposition (PECVD). Openings (as defined above) can then be formed through the hard mask material layer and into the dielectric material layer 12 by lithography and etching. The thus patterned hard mask material layer may be removed after forming the openings utilizing any well known material removal process.

A diffusion barrier material layer is then formed into each opening and on the topmost surface of the dielectric material layer 12. The diffusion barrier material layer includes a diffusion barrier material (i.e., a material that serves as a barrier to prevent a conductive material such as copper from diffusing there through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

An electrically conductive metal or metal alloy is formed into each opening and, is present, on the diffusion barrier material layer. Examples of electrically conductive metals that may be used in the present application include copper (Cu), aluminum (Al), or tungsten (W), while an example of an electrically conductive metal alloy is a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the dielectric material layer 12. The electrically conductive metal or metal alloy remaining in each opening is referred to herein as electrically conductive structure 16, while the diffusion barrier material layer that remains in each opening is referred to herein as diffusion barrier liner 14. The planarization stops on a topmost surface of the dielectric material layer 12. At this point of the present application, and as shown in FIG. 1, each electrically conductive structure 16 has a topmost surface that is coplanar with a topmost surface of the dielectric material layer 12, as well as, the topmost surfaces of the diffusion barrier liner 14. As is shown, a diffusion barrier liner 14 is located between the electrically conductive structure 16 and dielectric material layer 12. In some embodiments (not specifically shown), the diffusion barrier liner 14 may be omitted from the exemplary structure.

In some embodiments, the dielectric material layer 12, if present, the diffusion barrier liners 14, and the electrically conductive structures 16 form an interconnect level. In such an embodiment, copper or a copper alloy is typically used in providing each electrically conductive structure 16. In other embodiments, the dielectric material layer 12, if present, the diffusion barrier liners 14, and the electrically conductive structures 16 form a middle-of-the-line (MOL) level. In such an embodiment, tungsten is typically used in providing each electrically conductive structure 16.

Figure 2:
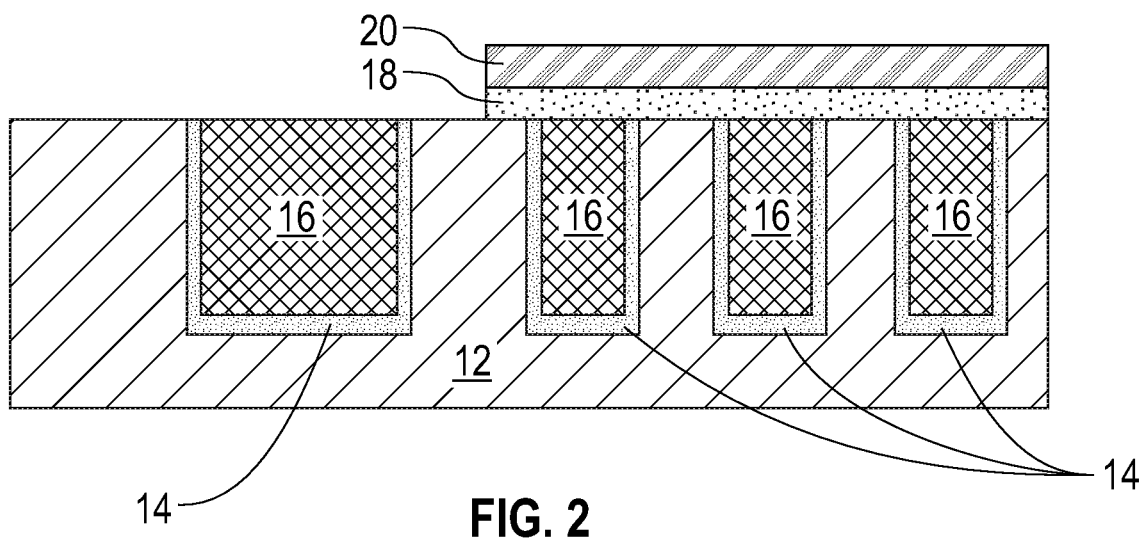
FIG. 2 is a cross sectional view of the exemplary semiconductor structure of FIG. 1 after forming a block mask over the dielectric material layer, and in a non-MRAM device area of the structure.

Referring now to FIG. 2, there is illustrated the exemplary semiconductor structure of FIG. 1 after forming a block mask (18/20) over the dielectric material layer 12, and in the non-MRAM device area 102 of the structure. In some embodiments of the present application and as is illustrated, the block mask includes a material stack of a first block mask material 18 and a second block mask material 20. In other embodiments, a block mask including a single block mask material can be employed. In yet other embodiments, a block mask including more than two block mask materials can be employed.

In the illustrated embodiment, and in one example, the first block mask material 18 may be composed of silicon nitride, while the second block mask material 20 may be composed of a metal nitride such as, for example, titanium nitride. Other block mask materials that are known to those skilled in the art may be used instead of a block mask composed of silicon nitride and titanium nitride.

The block mask may be formed by providing a blanket layer(s) of the block mask material(s), and then the blanket layer(s) of block mask material(s) by lithography and etching. The providing of the blanket layer(s) of the block mask material(s) may include a deposition process such, as, for example, CVD, PECVD, PVD, ALD or sputtering. The thickness of the block mask may vary depending on the type of deposition process(es) employed, as well as the number of layers present in the block mask. In one example, and for a block mask in which silicon nitride is employed as the first block mask material 18, and titanium nitride is employed as the second block mask material 20, the block mask may have a thickness from 10 nm to 50 nm.

Figure 3:
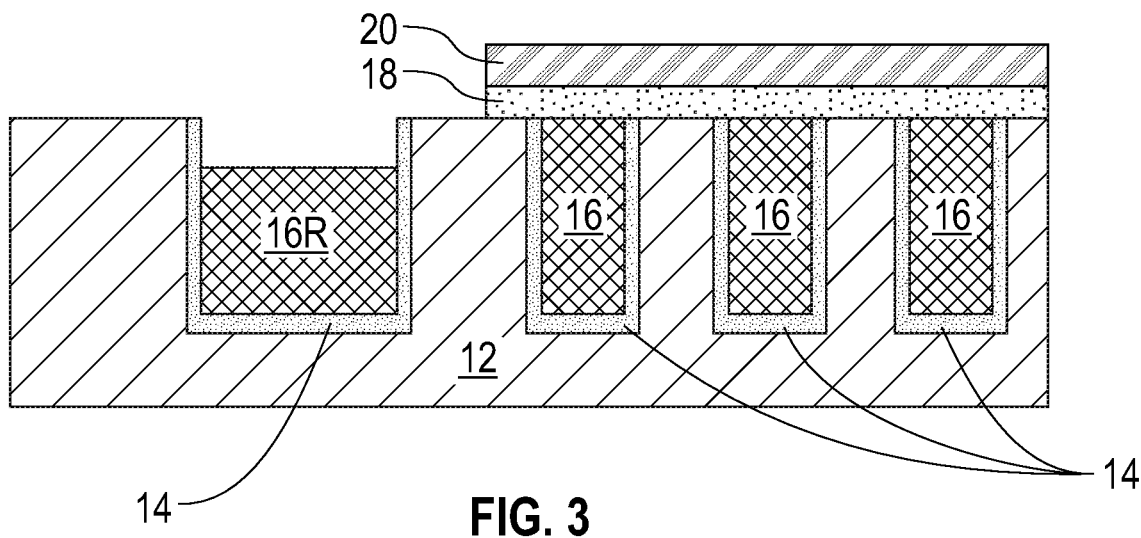
FIG. 3 is a cross sectional view of the exemplary semiconductor structure of FIG. 2 after recessing a physically exposed electrically conductive structure not protected by the block mask, and in a MRAM device area of the structure.

Referring now to FIG. 3, there is illustrated the exemplary semiconductor structure of FIG. 2 after recessing a physically exposed electrically conductive structure 16 not protected by the block mask (18/20), and in the MRAM device area 100 of the structure. After recessing, a portion of the electrically conductive structure 16 that is present in the MRAM device area 100 of the structure remains in the opening. The remaining portion of the electrically conductive structure 16 that is present after recessing and in the MRAM device area 100 may be referred to herein as a recessed electrically conductive structure 16R. The recessed electrically conductive structure 16R has a topmost surface that is below at least the topmost surface of the dielectric material layer 12. In embodiments in which the diffusion barrier liner 14 is present, the topmost surface of the recessed electrically conductive structure 16R is below the topmost surfaces of the diffusion barrier liner 14.

The recessing of the physically exposed electrically conductive structure 16 not protected by the block mask (18/20) may be performed utilizing an etching process that is selective in removing the electrically conductive metal or metal alloy that provides the electrically conductive structure 16. In embodiments in which the electrically conductive structure 16 is composed of copper, alanine may be used as an etchant. In embodiments in which the electrically conductive structure 16 is composed of tungsten, hydrogen peroxide may be used as the etchant.

Figure 4:
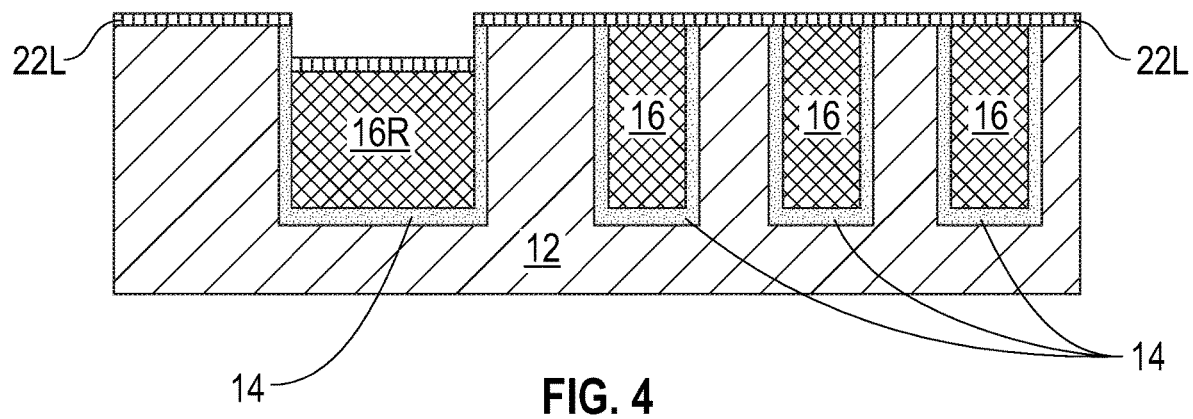
FIG. 4 is a cross sectional view of the exemplary semiconductor structure of FIG. 3 after removing the block mask and forming a bottom metal nitride layer.

Referring now to FIG. 4, there is illustrated the exemplary semiconductor structure of FIG. 3 after removing the block mask (18/20) and forming a bottom metal nitride layer 22L. The block mask (18/20) may be removed utilizing one or more material removal processes such as, for example, etching and/or planarization. The bottom metal nitride layer 22L is then formed utilizing a directional deposition process in which the bottom metal nitride layer 22L is formed only upon physically exposed horizontal surfaces, not vertical surfaces. Thus, the bottom metal nitride layer 22L is formed on the physically exposed topmost surface of each of the dielectric material layer 12, the diffusion barrier liner 14, and the recessed electrically conductive structure 16R. In one example, sputtering can be used as the directional deposition process.

The bottom metal nitride layer 22L may have a thickness from 2 nm to 30 nm. Other thicknesses are possible for the bottom metal nitride layer 22L as long as the bottom metal nitride layer 22L does not fill in the entirety of the removed portion of the electrically conductive structure 16 in the MRAM device area 100. The presence of the bottom metal nitride layer 22L on the dielectric material layer 12 prevents dishing out of the dielectric material layer 12 during the formation of the TaN-containing landing pad 24P.

The bottom metal nitride layer 24L is composed of a metal nitride other than TaN. In one embodiment, the bottom metal nitride layer 24L is composed of ZrN. Other metal nitrides that can be used as the bottom metal nitride layer 24L include, for example, CrN, WN, TiN, MoN, HfN, ZrHfN or ScN. Metal nitride that provides the bottom metal nitride layer 24L may be the same or different from the diffusion barrier material mentioned above for diffusion barrier liner 14 provided that TaN is not used for the bottom metal nitride layer 22L.

Figure 5:
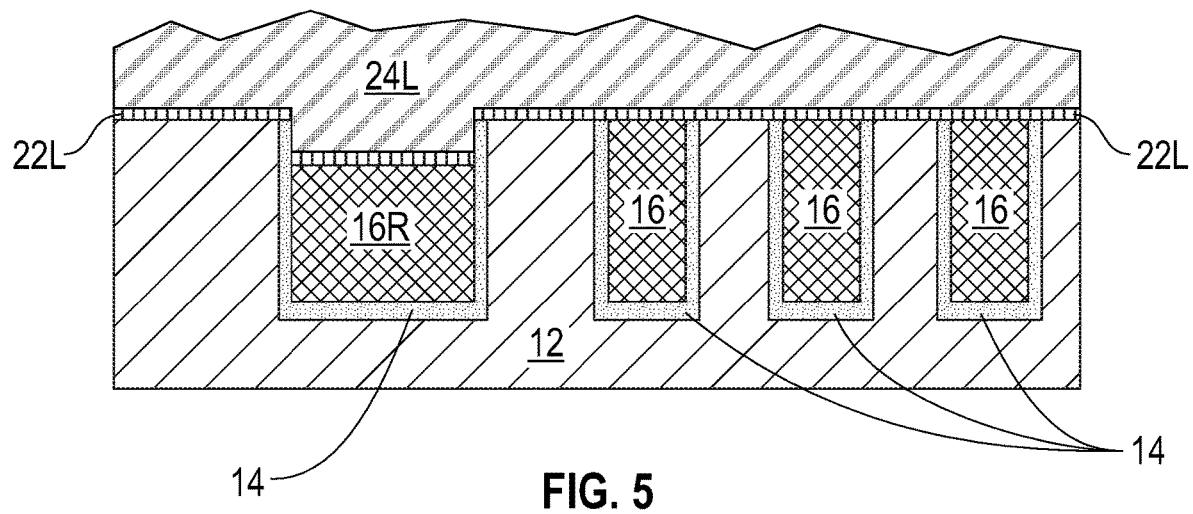
FIG. 5 is a cross sectional view of the exemplary semiconductor structure of FIG. 4 after forming a TaN-containing layer on the bottom metal nitride layer.

Referring now to FIG. 5, there is illustrated the exemplary semiconductor structure of FIG. 4 after forming a TaN-containing layer 24L on the bottom metal nitride layer 22L. The term "TaN-containing" denotes a material that contains at least Ta and N. In one embodiment, the TaN-containing layer 24L is composed of TaN. In another example, the TaN-containing layer 24L is composed of TaCN. The TaN-containing layer 24L may be formed utilizing a deposition such as, for example, sputtering, CVD, PECVD, or ALD. The TaN-containing layer 24L may be a non-conformal layer, as is shown in FIG. 5, or the TaN-containing layer 24L may be a conformal layer. The TaN-containing layer 24L typically includes an overburden portion that extends outside the opening containing the recessed electrically conductive structure 16R.

Figure 6:
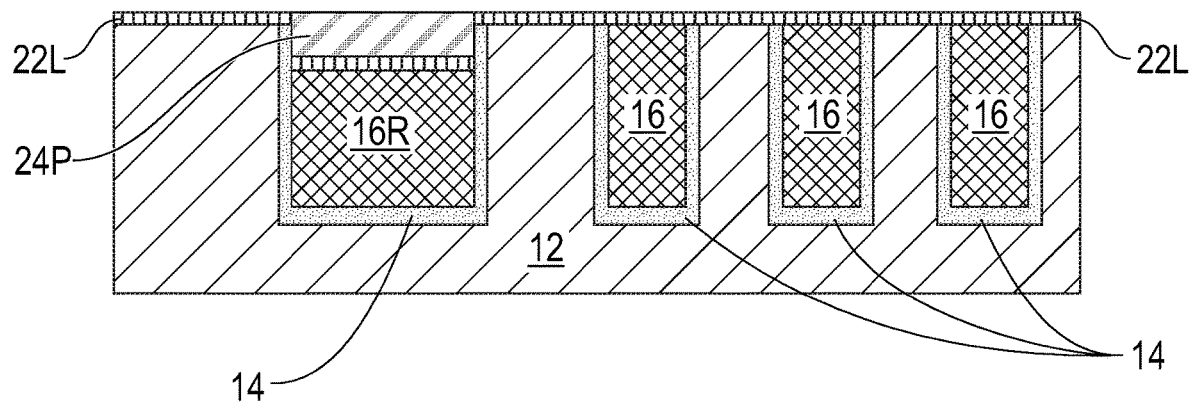
FIG. 6 is a cross sectional view of the exemplary semiconductor structure of FIG. 5 after performing a planarization process stopping on a topmost surface of the bottom metal nitride layer.

Referring now to FIG. 6, there is illustrated the exemplary semiconductor structure of FIG. 5 after performing a planarization process such as, for example, chemical mechanical polishing, stopping on a topmost surface of the bottom metal nitride layer 22L. A portion of the TaN-containing layer 24L remains on the recessed electrically conductive structure. This remaining portion of the TaN-containing layer 24L that is present on the recessed electrically conductive structure 16R is referred to herein as a TaN-containing landing pad 24P. At this point of the present application, the TaN-containing landing pad 24P has a topmost surface that is coplanar with a topmost surface of the bottom metal nitride layer 22L that is present on the topmost surface of the dielectric material layer 12.

Figure 7:
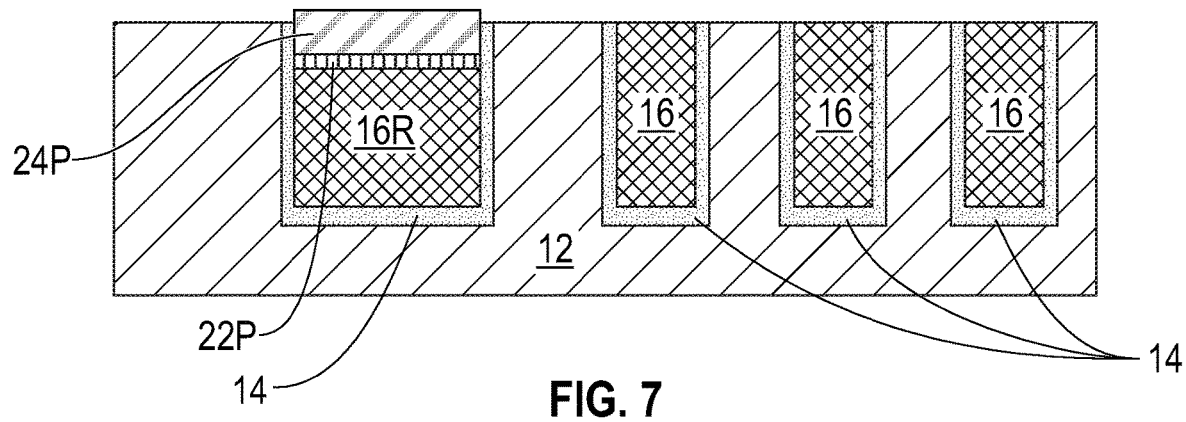
FIG. 7 is a cross sectional view of the exemplary semiconductor structure of FIG. 6 after removing physically exposed portions of the bottom metal nitride layer.

Referring now to FIG. 7, there is illustrated the exemplary semiconductor structure of FIG. 6 after removing physically exposed portions of the bottom metal nitride layer 22L. The physically exposed portions of the bottom metal nitride layer 22L can be removed utilizing an etching process that is selective in removing the bottom metal nitride layer 22L. In one example, and when ZrN or TiN is used as the bottom metal nitride layer 22L, buffered hydrogen fluoride can be used as the etchant. The bottom metal nitride layer 22L that is present beneath the TaN-containing landing pad 24P remains. The remaining bottom metal nitride layer 22L that is present beneath the TaN-containing landing pad 24P is referred herein as a bottom metal nitride landing pad 22P. Collectively, the TaN-containing landing pad 24P and the bottom metal nitride landing pad 22P provide a dual metal nitride landing pad of the present application. As is shown, a bottommost surface of the TaN-containing landing pad 24P is in direct physical contact with a topmost surface of the bottom metal nitride landing pad 22P.

Figure 8:
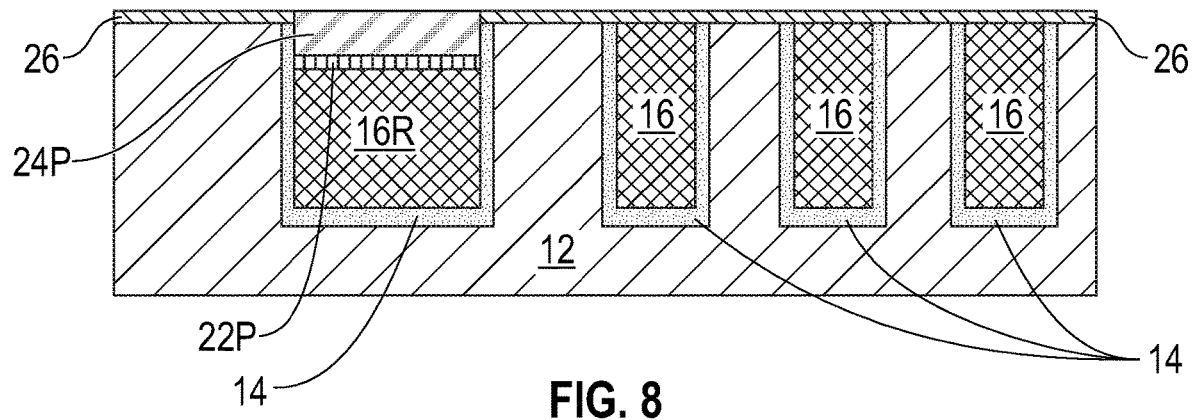
FIG. 8 is a cross sectional view of the exemplary semiconductor structure of FIG. 7 after forming a dielectric capping layer having a topmost surface that is coplanar with a topmost surface of a remaining portion (i.e., a TaN-containing landing pad) of the TaN-containing layer that is present on the recessed electrically conductive structure.

Referring now to FIG. 8, there is illustrated the exemplary semiconductor structure of FIG. 7 after forming a dielectric capping layer 26 having a topmost surface that is coplanar with a topmost surface of a remaining portion (i.e., the TaN-containing landing pad 24P) of the TaN-containing layer 24L that is present on the recessed electrically conductive structure 16R.

The dielectric capping layer 26 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the dielectric capping layer 26 may be formed utilizing a deposition process such as, for example, CVD, PECVD, ALD, chemical solution deposition or evaporation. When present, dielectric capping layer 26 may have a thickness from 10 nm to 100 nm. Other thicknesses that are lesser than 10 nm, or greater than 100 nm may also be used as the thickness of the dielectric capping layer 26.

Figure 9:
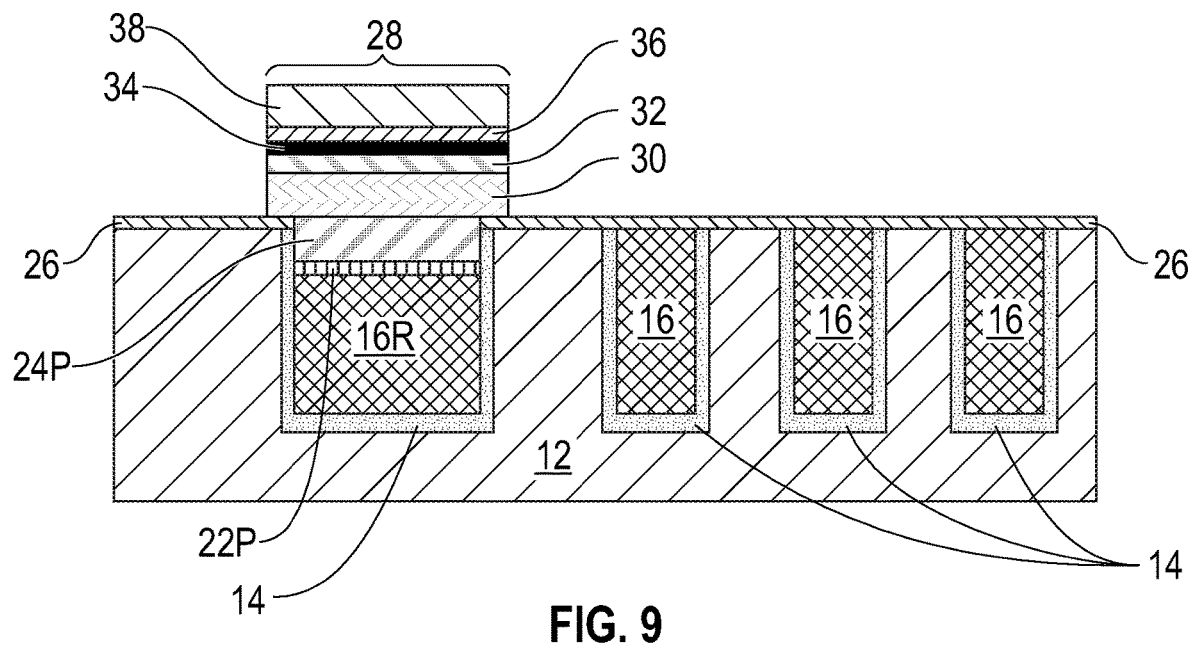
FIG. 9 is a cross sectional view of the exemplary semiconductor structure of FIG. 8 after forming a magnetic tunnel junction (MTJ) structure on the TaN-containing landing pad.

Referring now to FIG. 9, there is illustrated the exemplary semiconductor structure of FIG. 8 after forming a magnetic tunnel junction (MTJ) structure 28 on the TaN-containing landing pad 24P. The magnetic tunnel junction (MTJ) structure 28 may include a synthetic anti-ferromagnetic ferromagnetic (SAF) layer 30, a reference layer 32, a tunnel barrier 34, a free layer 36, and a capping layer 38. Other MTJ structures are contemplates and can be used in the present application.

The MTJ structure 28 can be formed by depositing blanket layers of the various materials of the MTJ structure 28, and thereafter patterning the blanket layers of the various materials utilizing lithography and etching. The depositing of the blanket layers may include CVD, PECVD, PVD, or sputtering.

The synthetic anti-ferromagnetic (SAF) layer 30 has a fixed magnetization and may include a cobalt-based alloy such as for example, cobalt-platinum. The thickness of the synthetic anti-ferromagnetic (SAF) layer 30 may be from 1.5 nm 15 nm. In some embodiments, the SAF layer 30 is omitted.

The reference layer 32 also has a fixed magnetization. The reference layer 32 may be composed of a metal or metal alloy that includes one or more metals exhibiting high spin polarization. In alternative embodiments, exemplary metals for the formation of the reference layer 32 include iron, nickel, cobalt, chromium, boron, and manganese. Exemplary metal alloys may include the metals exemplified by the above. In another embodiment, the reference layer 32 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The thickness of the reference layer 32 will depend on the material selected. In one example, the reference layer 32 may have a thickness from 0.3 nm to 3 nm.

Tunnel barrier 34 is composed of an insulator material and is formed at such a thickness as to provide an appropriate tunneling resistance. Exemplary materials for the tunnel barrier 34 include magnesium oxide, aluminum oxide, and titanium oxide, or materials of higher electrical tunnel conductance, such as semiconductors or low-bandgap insulators. The thickness of the tunnel barrier 34 will depend on the material selected. In one example, the tunnel barrier 34 may have a thickness from 0.5 nm to 1.5 nm.

Free layer 36 is composed of a magnetic material with a magnetization that can be changed in orientation relative to the magnetization orientation of the synthetic anti-ferromagnetic (SAF) layer 30 and the reference layer 32. Exemplary materials for the free layer 36 include alloys and/or multilayers of cobalt, iron, alloys of cobalt-iron, nickel, alloys of nickel-iron, and alloys of cobalt-iron-boron. The free layer 36 may have a thickness from 0.3 nm to 3 nm.

Capping layer 38 may include one or more different kinds of oxides. Exemplary oxide materials for the cap layer 114 include metal oxides such oxides of aluminum, oxides of magnesium, oxides of magnesium and titanium, oxides of magnesium and tantalum, oxides of titanium, oxides of tantalum, oxides of tungsten, oxides of iridium, oxides of zirconium, and oxides of ruthenium, among others. In one example, the capping layer 38 includes tantalum oxide and/or ruthenium oxide. In yet other embodiments, the capping layer includes a metal cap such as for example, tantalum and/or ruthenium. The capping layer 38 may have a thickness from 0.5 nm to 2 nm.

In one embodiment, the synthetic anti-ferromagnetic (SAF) layer 30 may include a cobalt (Co)-based synthetic anti-ferromagnetic (SAF), the reference layer 32 may include a cobalt-iron-boron boron (CoFeB)-based alloy, the tunnel barrier 36 may include magnesium oxide (MgO), the free layer 26 may include a CoFeB-based free layer, and the capping layer 38 may include tantalum and/or ruthenium.

Figure 10:
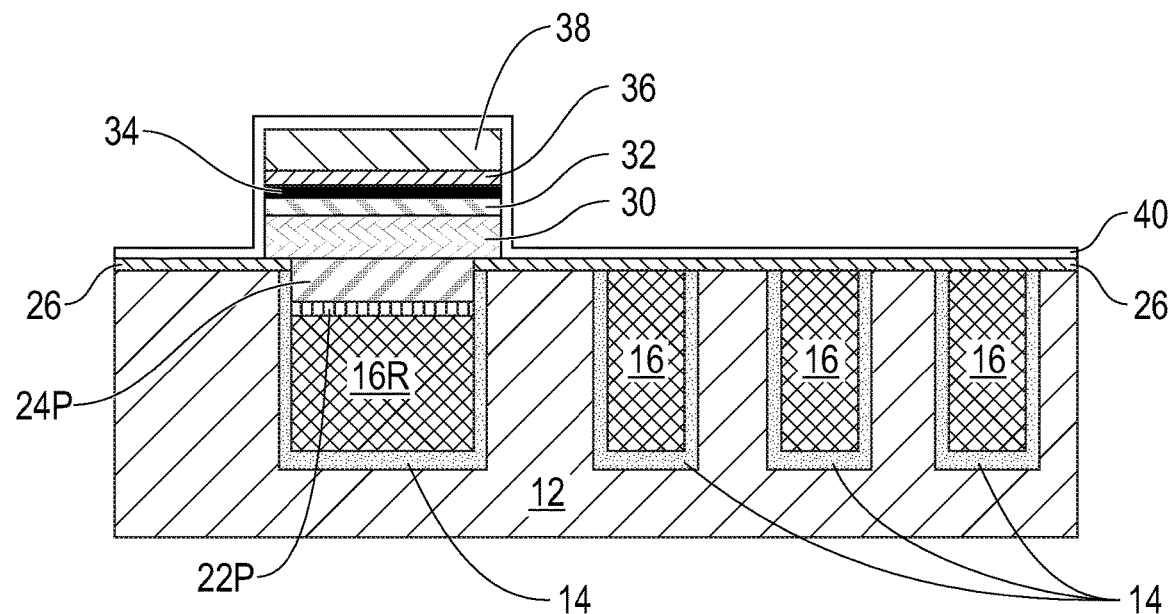
FIG. 10 is a cross sectional view of the exemplary semiconductor structure of FIG. 9 after forming an insulator layer encapsulating the MTJ structure.

Referring now to FIG. 10, there is illustrated the exemplary semiconductor structure of FIG. 9 after forming an insulator layer 40 encapsulating the MTJ structure 28. Insulating layer 40 includes a dielectric material that has a different composition than the ILD material 42 to be subsequently formed. Insulating layer 40 may include a same or different dielectric material as dielectric capping layer 26. In one embodiment, insulator layer 42 is composed of a silicon dioxide, silicon nitride or a silicon oxynitride. The insulator layer 40 is a continuous layer that is formed on all physically exposed surfaces (including the topmost and sidewall surfaces) of the MTJ structure 28 and on the physically exposed surfaces of the dielectric capping layer 26.

Figure 11:
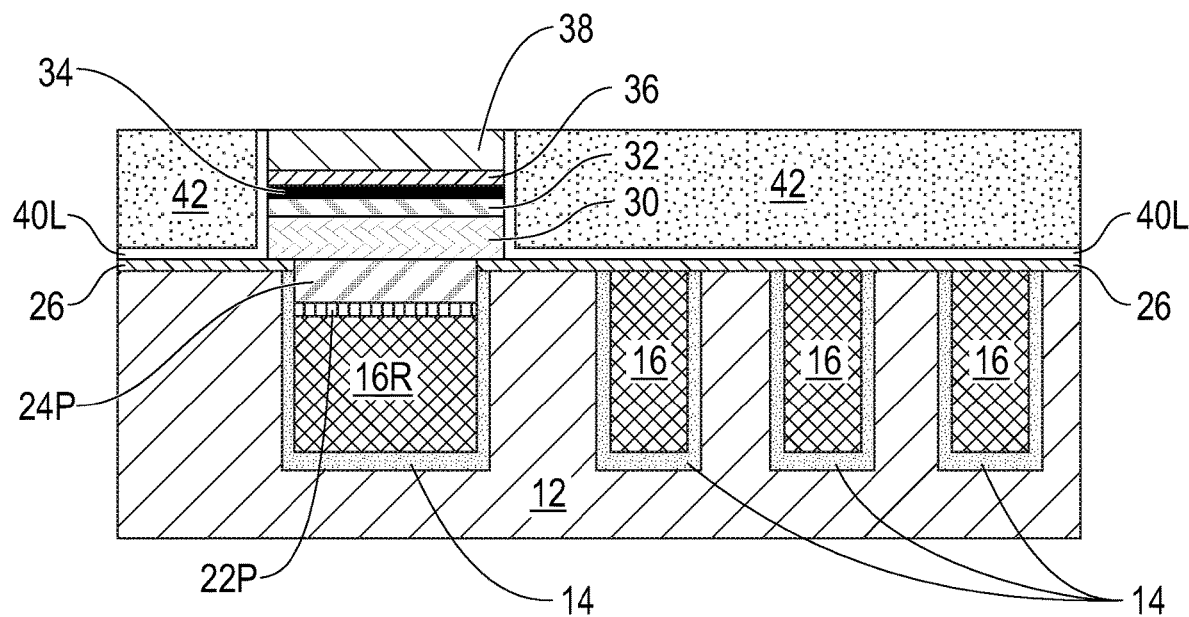
FIG. 11 is a cross sectional view of the exemplary semiconductor structure of FIG. 10 after forming an interlayer dielectric (ILD) material layer having a topmost surface that is coplanar with a topmost surface of the MTJ structure.

Referring now to FIG. 11, there is illustrated the exemplary semiconductor structure of FIG. 10 after forming an interlayer dielectric (ILD) material layer 42 having a topmost surface that is coplanar with a topmost surface of the MTJ structure 28; i.e. a topmost surface of the capping layer 38.

The ILD material layer 42 may be composed of undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the ILD material layer 42 can be formed utilizing a deposition process including, for example, chemical vapor deposition (CVD), plasma enhanced chemical vapor deposition (PECVD), evaporation or spin-on coating. A planarization process, such as, for example, chemical mechanical polishing, follows the deposition of the dielectric material that provides the ILD material layer 42. The planarization process removes the insulator layer 40 that is present on the MTJ structure 28. The remaining insulator layer, that is present beneath the ILD material layer 42 and along the sidewall surfaces of the MTJ structure 28 may be referred to as insulator liner 40L.

Figure 12:
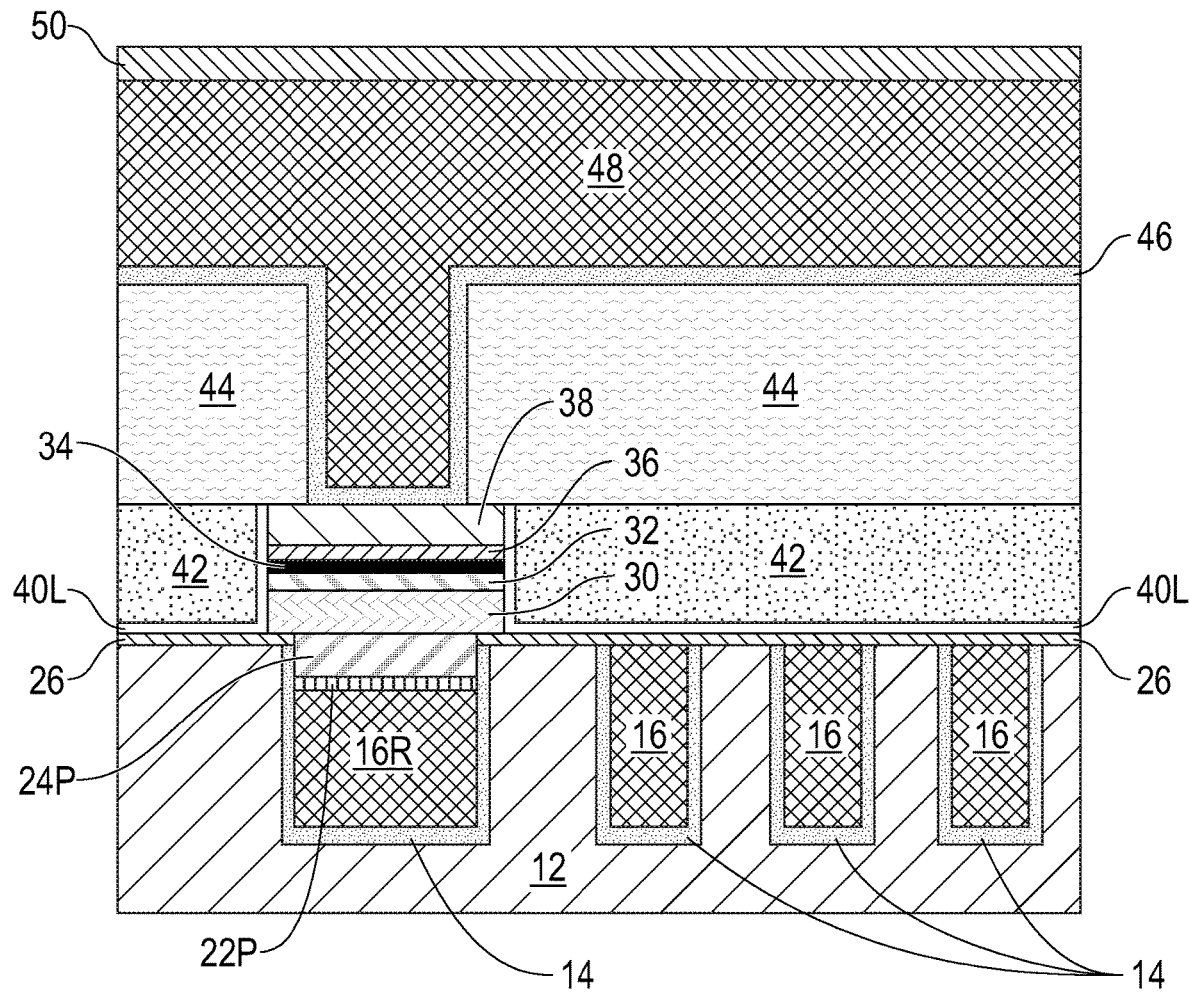
FIG. 12 is a cross sectional view of the exemplary semiconductor structure of FIG. 11 after performing back-end-of-the-line processing.

Referring now to FIG. 12, there is illustrated the exemplary semiconductor structure of FIG. 11 after performing back-end-of-the-line (BEOL) processing. The BEOL processing includes forming an interconnect dielectric material layer 44 on the exemplary structure shown in FIG. 11. The interconnect dielectric material layer 44 may include one of the dielectric materials mentioned above for dielectric material layer 12. In one embodiment, interconnect dielectric material layer 44 is composed of a same dielectric material as dielectric material layer 12. In another embodiment, interconnect dielectric material layer 44 is composed of a different dielectric material than dielectric material layer 12. Interconnect dielectric material layer 44 may be formed by utilizing one of the deposition processes mentioned above in forming dielectric material layer 12. Interconnect dielectric material layer 44 may have a thickness within the thickness range mentioned above for dielectric material layer 12.

An opening is then formed into the interconnect dielectric material layer 44. The opening can be formed by lithography and etching. The opening physically exposes a topmost surface of the MTJ structure 28, i.e., the capping layer 38. A material stack of a diffusion barrier material layer 46 and an electrically conductive metal or metal alloy layer 48 is then formed on the physically exposed topmost surface of the interconnect dielectric material layer 44 and within the opening.

The diffusion barrier material layer 46 may include one of the diffusion barrier materials mentioned above for diffusion barrier liner 14. In one embodiment, diffusion barrier material layer 46 is composed of a same diffusion barrier material as diffusion barrier liner 14. In another embodiment, diffusion barrier material layer 46 is composed of a different diffusion barrier material than diffusion barrier liner 14. Diffusion barrier material layer 46 may be deposited utilizing one of the deposition processes mentioned above in forming diffusion barrier liner 14. Diffusion barrier material layer 46 may have a thickness within the thickness range mentioned above for diffusion barrier liner 14.

The electrically conductive metal or metal alloy layer 48 may include one of the electrically conductive metals or metal alloys mentioned above for the electrically conductive structures 16. In one embodiment, electrically conductive metal or metal alloy layer 48 is composed of a same electrically conductive metal or metal alloy as the electrically conductive structures 16. In another embodiment, electrically conductive metal or metal alloy layer 48 is composed of a different electrically conductive metal or metal alloy than the electrically conductive structures 16. Electrically conductive metal or metal alloy layer 48 may be deposited utilizing one of the deposition processes mentioned above in forming the electrically conductive structures 16.

Dielectric cap 50 is then formed on electrically conductive metal or metal alloy layer 48. The dielectric cap 50 may include one of the dielectric capping materials mentioned above for dielectric capping layer 26. In one embodiment, dielectric cap 50 is composed of a same dielectric capping material as dielectric capping layer 26. In another embodiment, dielectric cap 50 is composed of a different dielectric capping material than dielectric capping layer 26. Dielectric cap 50 may be deposited utilizing one of the deposition processes mentioned above in forming dielectric capping layer 26. Dielectric capping layer 50 may have a thickness within the thickness range mentioned above for dielectric capping layer 26.

Figure 13:
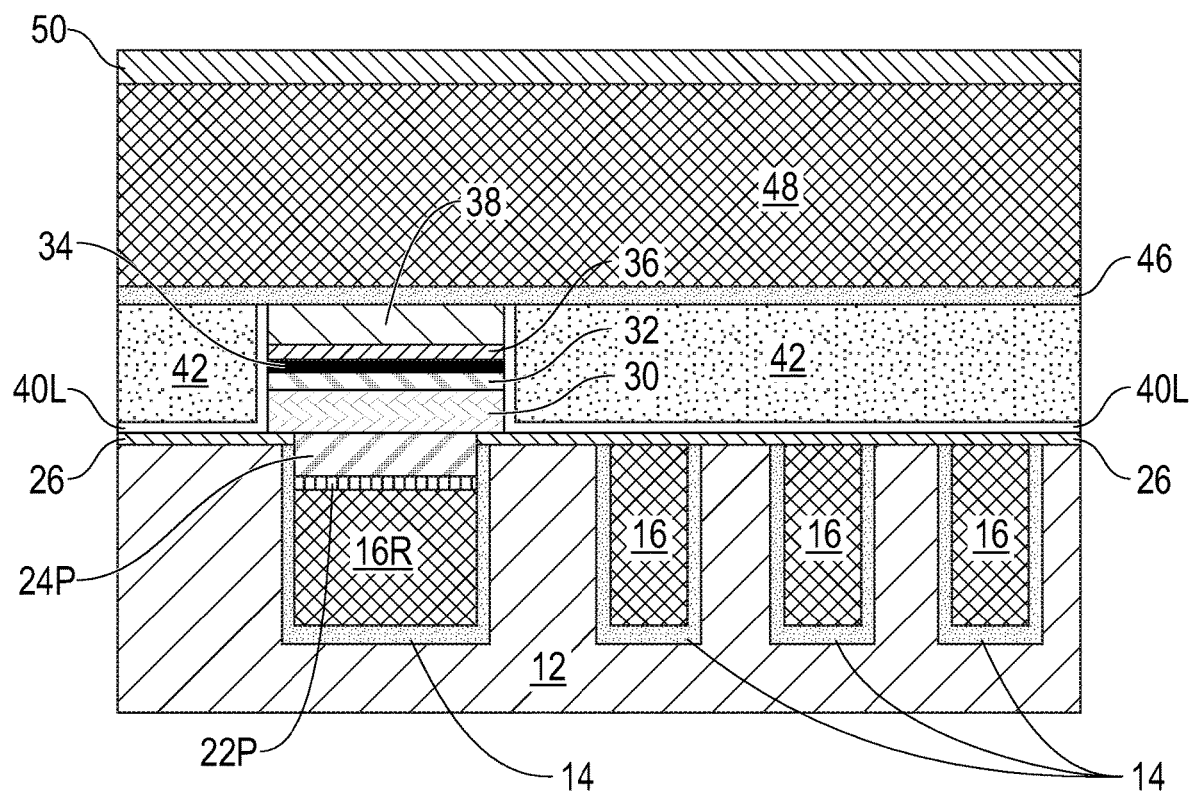
FIG. 13 is a cross sectional view of another exemplary semiconductor structure in accordance with an alternative embodiment of the present application.

Referring to FIG. 13, there is illustrated another exemplary semiconductor structure in accordance with an alternative embodiment of the present application. The exemplary semiconductor structure of FIG. 14 is similar to the exemplary semiconductor structure shown in FIG. 12 except that the interconnect dielectric material layer 44 has been omitted from the structure. This exemplary embodiment represents a conductive metal line level which acts as the top contact to the MTJ device, whereas the exemplary embodiment of FIG. 12 represents a conductive metal via level which acts as the top contact to the MTJ device.

FIGS. 12 and 13 illustrate exemplary semiconductor structures of the present application. Each structure illustrated in FIGS. 12 and 13 includes at least one electrically conductive structure 16R embedded in a dielectric material layer 12 and located in MRAM device area 100, the at least one electrically conductive structure 16R has a recessed surface. A dual nitride landing pad 22P/24P is located on recessed surface of the least one electrically conductive structure 16R in the MRAM device area 100, the dual nitride landing pad including a bottom metal nitride landing pad 22P and a TaN-containing landing pad 24P. A dielectric capping layer 26 is located on the dielectric material layer 12, the dielectric capping layer 26 has a topmost surface that is coplanar with a topmost surface of the TaN-containing landing pad 24P. A magnetic tunnel junction (MTJ) structure 28 is located on the TaN-containing landing pad 24P. An interlayer dielectric (ILD) material layer 42 is laterally adjacent the MTJ structure 28 and has a topmost surface that is coplanar with a topmost surface of the MTJ structure 28. At least an electrically conductive metal or metal alloy layer 48 is located on the MTJ structure 28 and the ILD material layer 42. It is noted that no dishing of the dielectric material layer 12 is observed in the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
    providing at least one electrically conductive structure embedded in a dielectric material layer and located in a MRAM device area, and at least one other electrically conductive structure embedded in the dielectric material layer and located in a non-MRAM device area;
    recessing the at least one electrically conductive structure in the MRAM device area, wherein a block mask is formed over the non-MRAM device area prior to the recessing of the at least one electrically conductive structure in the MRAM device area;
    removing the block mask that is formed over the non-MRAM device area;
    forming, after the removing of the block mask, a dual nitride landing pad on a recessed surface of the least one electrically conductive structure in the MRAM device area, the dual nitride landing pad comprising a bottom metal nitride landing pad and a TaN-containing landing pad;
    forming a dielectric capping layer on the dielectric material layer, the dielectric capping layer having a topmost surface that is coplanar with a topmost surface of the TaN-containing landing pad;
    forming a magnetic tunnel junction (MTJ) structure on the TaN-containing landing pad;
    forming an interlayer dielectric (ILD) material layer laterally adjacent the MTJ structure and having a topmost surface that is coplanar with a topmost surface of the MTJ structure; and
    forming at least an electrically conductive metal or metal alloy layer on the MTJ structure and the ILD material layer.

2. The method of claim 1, wherein the forming of the dual nitride landing pad comprises:
    forming, by a directional deposition process, a bottom metal nitride layer on a physically exposed surface of the dielectric material layer and on the recessed surface of the at least one electrically conductive structure;
    forming a TaN-containing layer on the bottom metal nitride layer;
    performing a planarization process to remove the TaN-containing layer located on the bottom metal nitride layer that is present on the physically exposed surface of the dielectric material layer, while the TaN-containing layer atop the recessed surface of the at least one electrically conductive structure; and
    removing physically exposed portions of the bottom metal nitride layer not protected by maintained TaN-containing layer.

3. The method of claim 1, wherein the MTJ comprises a synthetic anti-ferromagnetic (SAF) layer, a reference layer, a tunnel barrier, a free layer, and a capping layer, and the forming of the MTJ structure comprises forming blanket layers of the SAF layer, the reference layer, the tunnel barrier, the free layer, and the capping layer, and patterning the blanket layers.

4. The method of claim 1, further comprising forming, prior to forming the ILD material, an insulator layer on the MTJ structure, wherein the insulator layer is located on the topmost surface is removed during the forming of the ILD material.

5. The method of claim 1, wherein the forming of the at least electrically conductive metal or metal alloy layer comprises:
forming an interconnect dielectric material layer having an opening on the ILD material; wherein the opening physically exposes a topmost surface of the MTJ structure;
forming a diffusion barrier material layer on the interconnect dielectric material layer and within the opening; and
depositing the electrically conductive metal or metal alloy layer on the diffusion barrier material layer.

6. The method of claim 1, wherein the forming of the at least electrically conductive metal or metal alloy layer comprises:
forming a diffusion barrier material layer on ILD material and on the MTJ structure; and
depositing the electrically conductive metal or metal alloy layer on the diffusion barrier material layer.

7. The method of claim 1, wherein the at least one electrically conductive structure and the electrically conductive metal or metal alloy layer are composed of copper or a copper alloy.

8. The method of claim 1, wherein the at least one electrically conductive structure is composed of tungsten and the electrically conductive metal or metal alloy layer is composed of copper or a copper alloy.

9. The method of claim 1, wherein the TaN-containing landing pad is composed of TaN or TaCN.

10. The method of claim 9, wherein the bottom metal nitride landing pad is composed of ZrN, CrN, WN, TiN, MoN, HfN, ZrHfN or ScN.

* * * * *